(12) United States Patent
Raghu et al.

(10) Patent No.: US 8,902,647 B1
(45) Date of Patent: Dec. 2, 2014

(54) WRITE SCHEME FOR CHARGE TRAPPING MEMORY

(71) Applicant: SanDisk Technologies Inc., Plano, TX (US)

(72) Inventors: Deepak Raghu, Milpitas, CA (US); Chris Avila, Saratoga, CA (US); Gautam A. Dusija, Milpitas, CA (US); Yingda Dong, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/289,230

(22) Filed: May 28, 2014

Related U.S. Application Data

(63) Continuation of application No. 14/099,130, filed on Dec. 6, 2013.

(51) Int. Cl.
*G11C 16/04* (2006.01)
*G11C 16/34* (2006.01)
(52) U.S. Cl.
CPC ................................ *G11C 16/3427* (2013.01)
USPC ............ 365/185.02; 365/185.28; 365/185.11; 365/185.09
(58) Field of Classification Search
USPC ............. 365/185.02, 185.28, 185.17, 185.09, 365/185.11
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,595,924 A | 1/1997 | Yuan et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 8,385,131 B2 * | 2/2013 | Seol ......................... | 365/185.28 |
| 8,472,257 B2 | 6/2013 | Dong et al. | |
| 2011/0267885 A1 | 11/2011 | Kato | |
| 2012/0220088 A1 | 8/2012 | Alsmeier | |
| 2013/0107628 A1 | 5/2013 | Dong et al. | |

OTHER PUBLICATIONS

U.S. Appl. No. 13/801,741 entitled "Weighted Read Scrub for Non-volatile Memory," filed Mar. 3.2013, 45 pages.
U.S. Appl. No. 13/791,200 entitled "Optimized Configurable NAND Parameters," filed Mar. 8, 2013, 37 pages.
U.S. Appl. No. 61/731,198, filed Nov. 29, 2012, 32 pages.
U.S. Appl. No. 61/731,215, filed Nov. 29, 2012, 42 pages.
U.S. Appl. No. 14/064,823, filed Oct. 28, 2013, 48 pages.
U.S. Appl. No. 14/064,887, filed Oct. 28, 2013, 42 pages.

(Continued)

*Primary Examiner* — David Lam
(74) *Attorney, Agent, or Firm* — Davis Wright Tremaine LLP

(57) ABSTRACT

In a charge trapping memory, data that would otherwise be likely to remain adjacent to unwritten word lines is written three times, along three immediately adjacent word lines. The middle copy is protected from charge migration on either side and is considered a safe copy for later reading. Dummy data may be programmed along a number of word lines to format a block for good data retention.

21 Claims, 15 Drawing Sheets

(56) References Cited

OTHER PUBLICATIONS

U.S. Appl. No. 13/908,905, filed Jun. 13, 2013, 48 pages.

Eitan et al., "NROM: A Novel Localized Trapping, 2-Bit Nonvolatile Memory Cell," IEEE Electron Device Letters, vol. 21, No. 11, Nov. 2000, pp. 543-545.

* cited by examiner

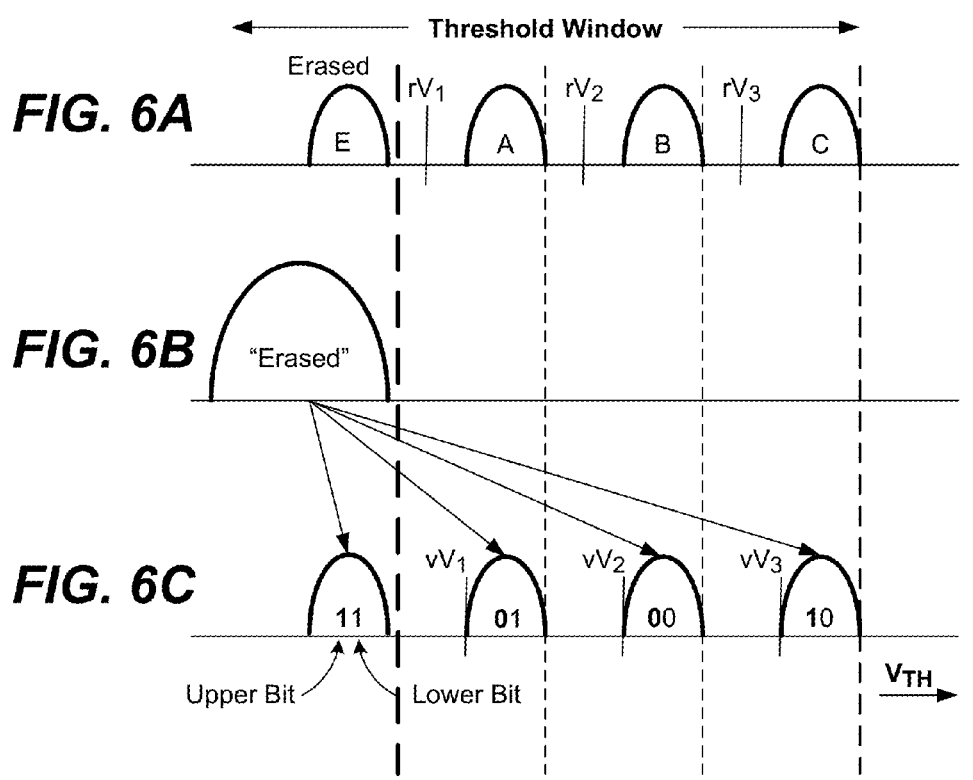
Programming into four states represented by a 2-bit code

|     | String 0 | String 1 | String 2 | String 3 | String 4 | String 5 | ... |
|-----|----------|----------|----------|----------|----------|----------|-----|
| WL0 | 0 ⇨ | 1 ⇨ | 2 ⇨ | 3 ⇨ | 4 ⇨ | 5 ⇨ | |
| WL1 | | | | | | | |
| WL2 | | | | | | | |
| WL3 | | | | | | | |
| WL4 | | | | | | | |
| ... | | | | | | | |
*FIG. 11*
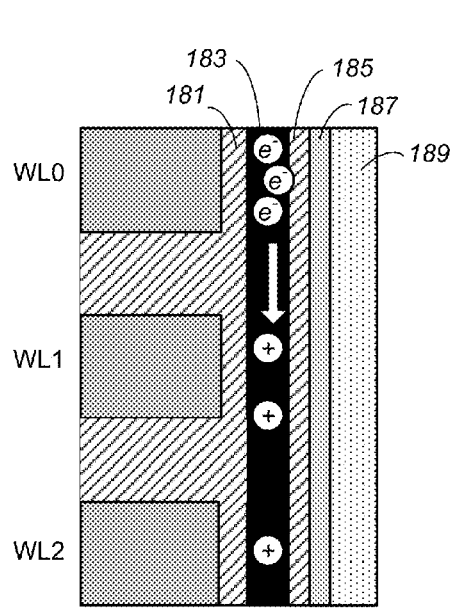
*FIG. 12*
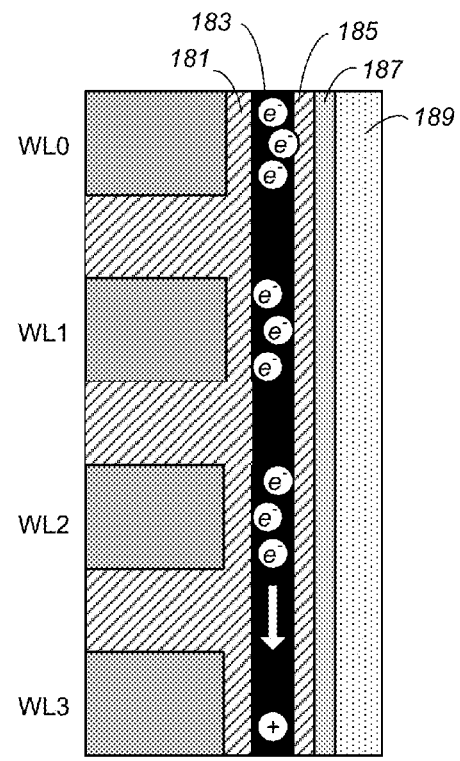
*FIG. 13*

|     | String 0 | String 1 | String 2 | String 3 | String 4 | String 5 | ... |
|-----|----------|----------|----------|----------|----------|----------|-----|
| WL0 | 0 | 1 | 2 | 3 | 4 | | |
| WL1 | 0 ⇨ | 1 ⇨ | 2 ⇨ | 3 ⇨ | 4 | | |
| WL2 | 0 | 1 | 2 | 3 | 4 | | |
| WL3 | | | | | | | |
| WL4 | | | | | | | |
| ... | | | | | | | |

|     | String 0 | String 1 | String 2 | String 3 | String 4 | String 5 | ... |
|-----|----------|----------|----------|----------|----------|----------|-----|
| WL0 | 0 | 1 | 2 | 3 | 4 | 5 | |
| WL1 | 0 | 1 | 2 | 3 | 4 | 5 | |
| WL2 | 0 | 1 | 2 | 3 | 4 | 5 | |
| WL3 | N+1 | N+2 | N+3 | | | | |
| WL4 | N+1 | N+2 | N+3 | | | | |
| WL5 | | | | | | | |
| ... | | | | | | | |

|  | String 0 | String 1 | String 2 | String 3 | String 4 | String 5 | ... |
|---|---|---|---|---|---|---|---|
| WL0 | dummy | dummy | dummy | dummy | dummy | dummy | dummy |
| WL1 | dummy | dummy | dummy | dummy | dummy | dummy | dummy |
| WL2 | dummy | dummy | dummy | dummy | dummy | dummy | dummy |
| ... | | | | | | | |
| WLX | dummy | dummy | dummy | dummy | dummy | dummy | dummy |
| WLX+1 | 0 | 1 | 2 | 3 | 4 | 5 | |
| WLX+2 | 0 | 1 | 2 | 3 | 4 | 5 | |
| WLX+3 | 0 | 1 | 2 | 3 | 4 | 5 | |
| WLX+2 | | | | | | | |
| WLX+3 | | | | | | | |
| ... | | | | | | | |

*FIG. 16*

WRITE SCHEME FOR CHARGE TRAPPING MEMORY

CROSS-RELATED APPLICATION

This application is a continuation of U.S. application Ser. No. 14/099,130 filed Dec. 6, 2013, which application is incorporated herein in its entirety by this reference.

BACKGROUND

This application relates to the operation of re-programmable nonvolatile memory systems such as semiconductor flash memories which record data using charge stored in charge trapping material.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. Flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

In certain charge trapping memories a portion of charge trapping material may extend to form charge storage elements of multiple cells. This may allow some charge migration between such memory cells over time, particularly where programmed cells (containing charge) are immediately adjacent to unprogrammed cells (containing no charge) for an extended period of time. To avoid this, data that is at risk for charge migration (e.g. because it is infrequently written data stored in dedicated blocks) may be written multiple times along multiple word lines so that at least one copy is not immediately adjacent to an unwritten word line. A copy that is immediately adjacent to an unwritten word line may be considered a sacrificial copy while a copy that is protected by the sacrificial copy may be considered a safe copy. An additional copy may protect the safe copy on the other side. Dummy data may be programmed on word lines in a block that is likely to otherwise remain with little data for an extended period of time so that the block is initialized to a partially written condition.

An example of a method of operating an array of charge-trapping memory cells includes: receiving a portion of data to be stored in the array; determining whether the portion of data is likely to be affected by charge migration between charge-trapping memory cells; and if the portion of data is likely to be affected by charge migration then storing a first copy of the portion of data along a first word line, storing a second copy of the portion of data along a second word line, and storing a third copy of the portion of data along a third word line, the first and third word lines lying immediately adjacent to the second word line on either side, the first, second, and third copies of the portion of data aligned so that each bit in a memory cell along the second word line is identical to bits in neighboring cells along the first and third word lines.

If the portion of data is not likely to be affected by charge migration then storing a single copy of the portion of data along a word line with other data along neighboring word lines on either side. Data that is likely to be affected by charge migration may be system control data, and the first, second, and third word lines may be in a block that is dedicated to storage of system control data. Prior to storing the first, second, and third copies of the portion of system control data in a dedicated block, dummy data may be programmed to a plurality of word lines of the dedicated block. The portion of data may subsequently be read from the array by reading only the second copy of the data. The portion of data may be written to the first, second, and third word lines from a set of on-chip data latches that maintain a copy of the portion of data throughout the writing to the first, second, and third word lines. The data may be written to the first, second, and third word lines in response to a single write command that indicates three copies of the data are to be written. Memory cells along the first, second, and third word lines may include charge trapping elements that are formed in portions of charge trapping material that extend in a direction that is perpendicular to the first, second, and third word lines. The portions of charge trapping material may be tubular portions that extend through vertical holes in the first, second, and third word lines. The portions of charge-trapping material may be strips that extend parallel to a plane of a substrate surface.

An example of a method of operating an array of charge-trapping memory cells includes: formatting a block of charge-trapping memory cells as a dedicated block for storage of system control data by programming a plurality of word lines of the block with dummy data; subsequently, receiving a portion of system control data to be stored in the dedicated block; and writing a first copy of the portion of system control data along a first word line, writing a second copy of the portion of system control data along a second word line, and writing a third copy of the portion of system control data along a third word line of the dedicated block, the first and third word lines lying immediately adjacent to the second word line on either side, the first, second, and third copies of the portion of system control data aligned so that each bit in a memory cell along the second word line is identical to bits in neighboring cells along the first and third word lines.

The dedicated block may include a plurality of sets of strings and the formatting may include programming at least one word line of each set of the plurality of sets of strings with dummy data. The dummy data may be randomly generated data. The dummy data may have a predetermined pattern that reduces charge migration from memory cells of later programmed cells in the dedicated block. The first, second, and third copies of the portion of system control data may be written from a latched copy of the portion of system control data that is maintained in on-chip data latches continuously throughout the writing of the first, second, and third copies of the portion of system control data. The writing of the first, second, and third copies of the portion of system control data may be performed in response to a single write command from a memory controller indicating that three copies of the portion of system control data should be written. The system control data may be firmware for memory system operation. The system control data may be mapping table data, or error log data.

An example of a nonvolatile charge-trapping memory system includes: an array of charge-trapping memory cells arranged in a plurality of individually erasable blocks, the plurality of individually erasable blocks including at least one dedicated block that is dedicated to storage of system control data; and a write circuit that is configured to write dummy data to a plurality of word lines of the dedicated block and to subsequently write three identical copies of system control data along three neighboring word lines of the dedicated block so that any three memory cells along the three neighboring word lines that are connected by charge trapping material are identically written.

The array of charge-trapping memory cells may be in series-connected strings that extend vertically from a substrate, each block containing a plurality of separately selectable sets of series-connected strings. The plurality of individually erasable blocks may include host data blocks that store data received from a host. The write circuit may not be configured to write dummy data to word lines of the host data blocks prior to storage of data received from the host, and may not be configured to write three identical copies of host data along word lines of the host data blocks.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of memory cells.

FIG. 11 illustrates programming of a system control block in 3-D memory.

FIG. 12 illustrates charge migration in a 3-D charge trapping memory.

FIG. 13 illustrates cells of neighboring word lines having the same charge in a 3-D charge trapping memory.

FIG. 16 illustrates dummy data programmed in a 3-D charge trapping memory.

DETAILED DESCRIPTION

Memory System

Figure 1:
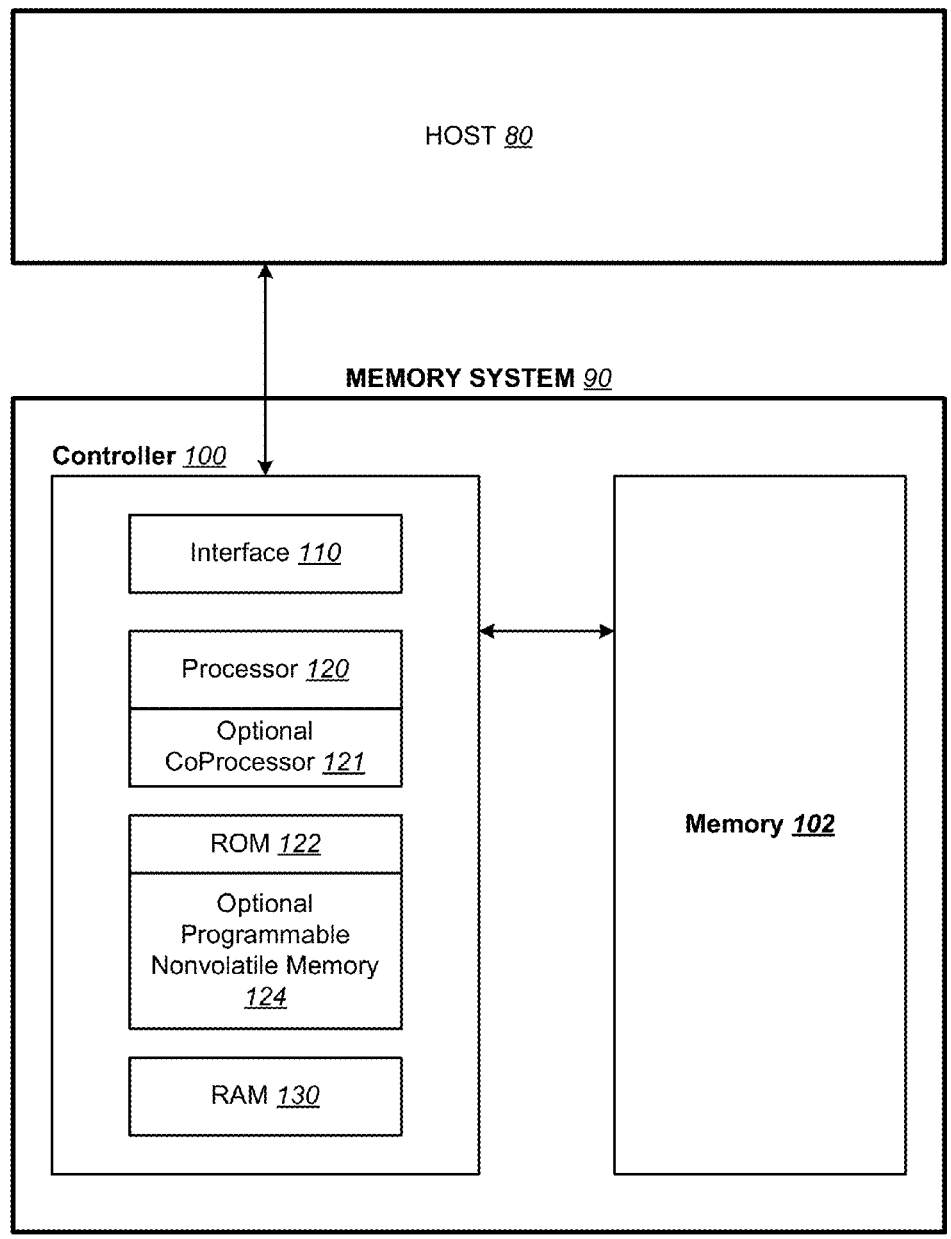
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
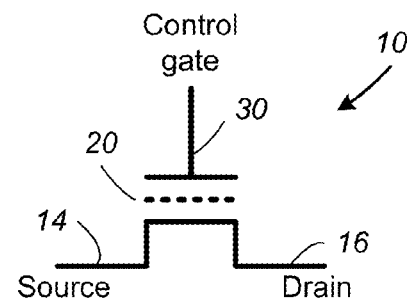
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
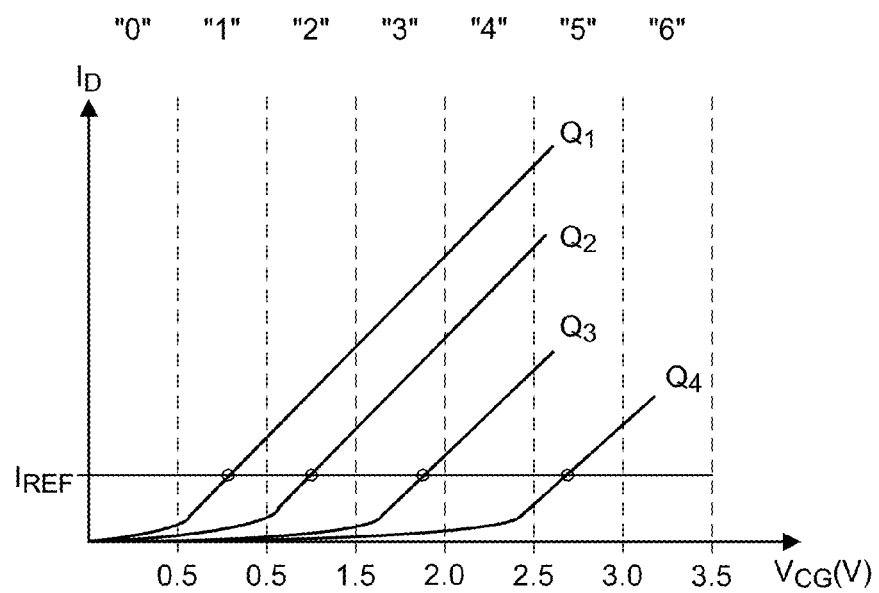
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
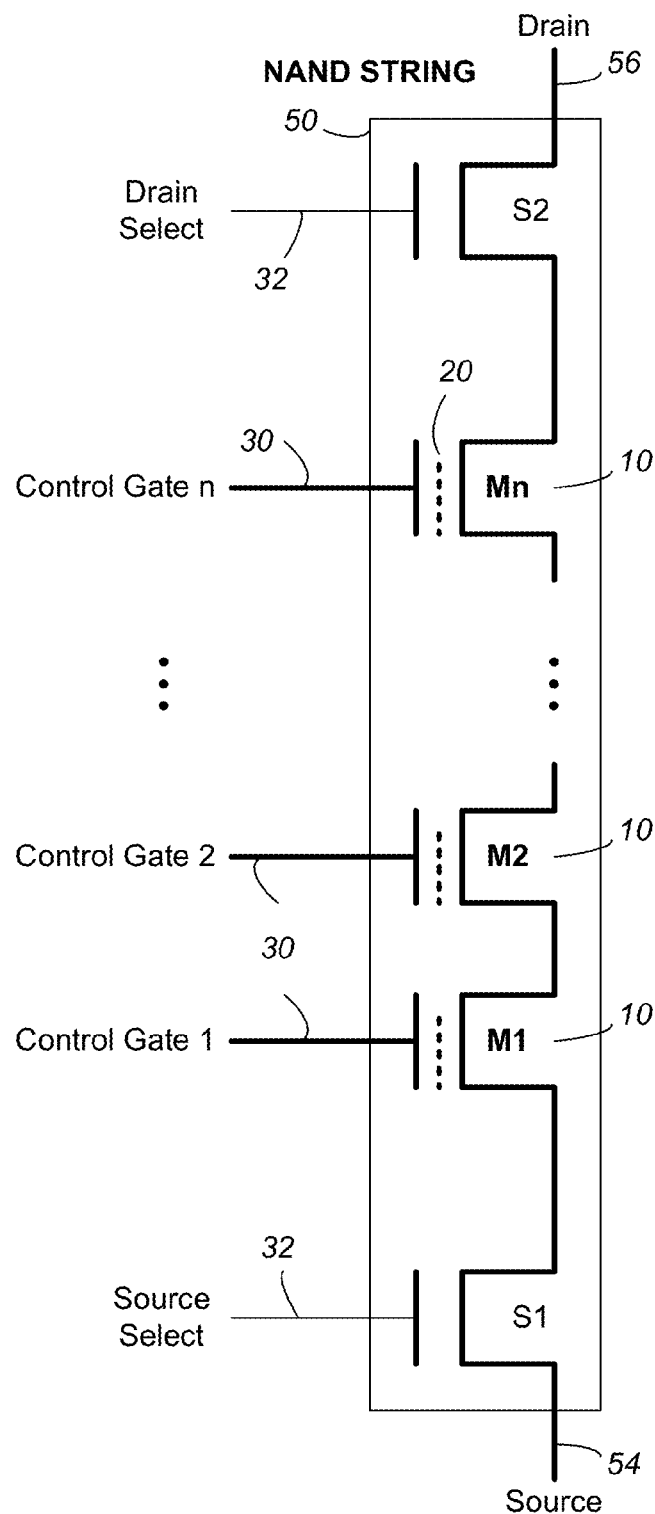
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
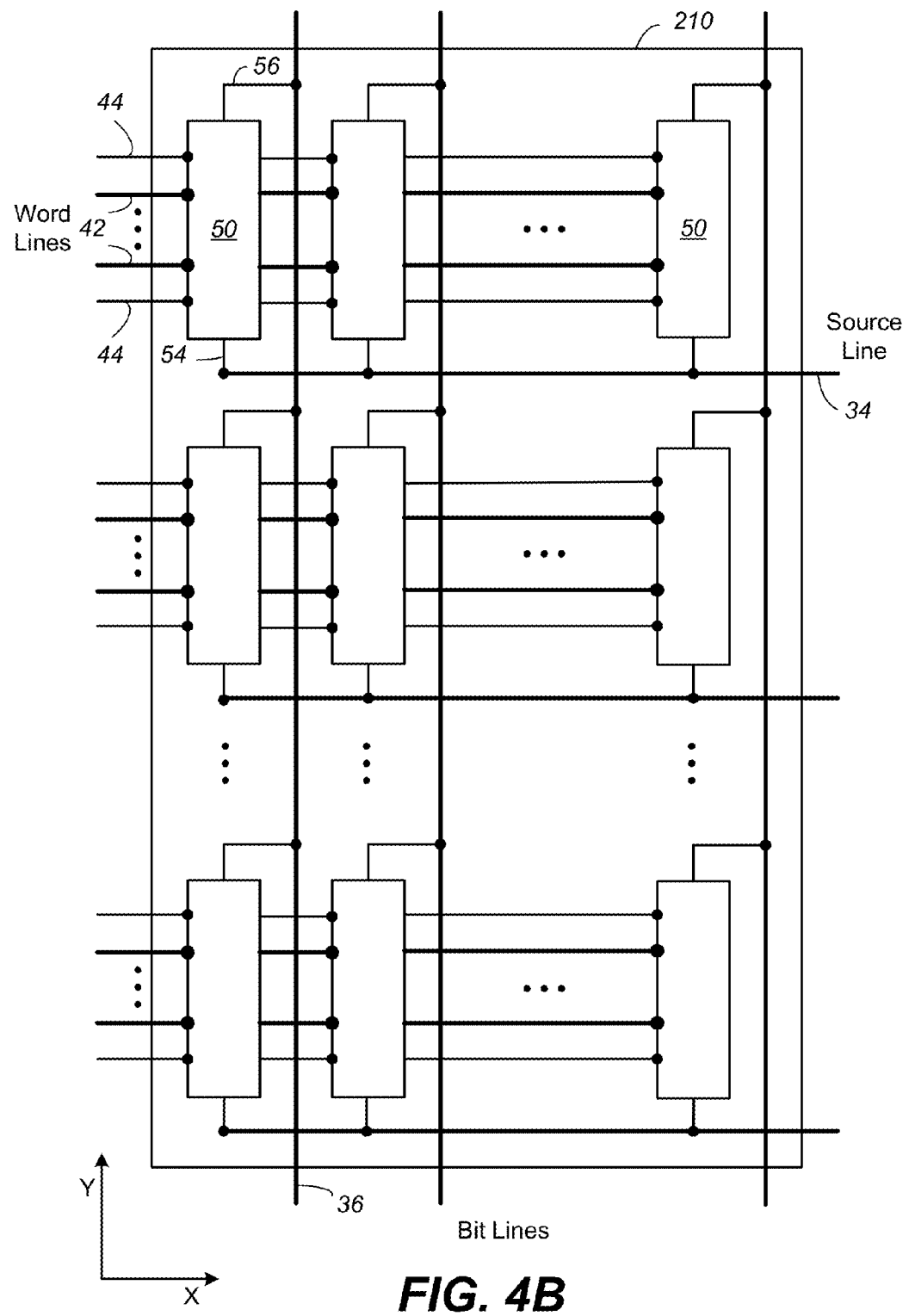
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
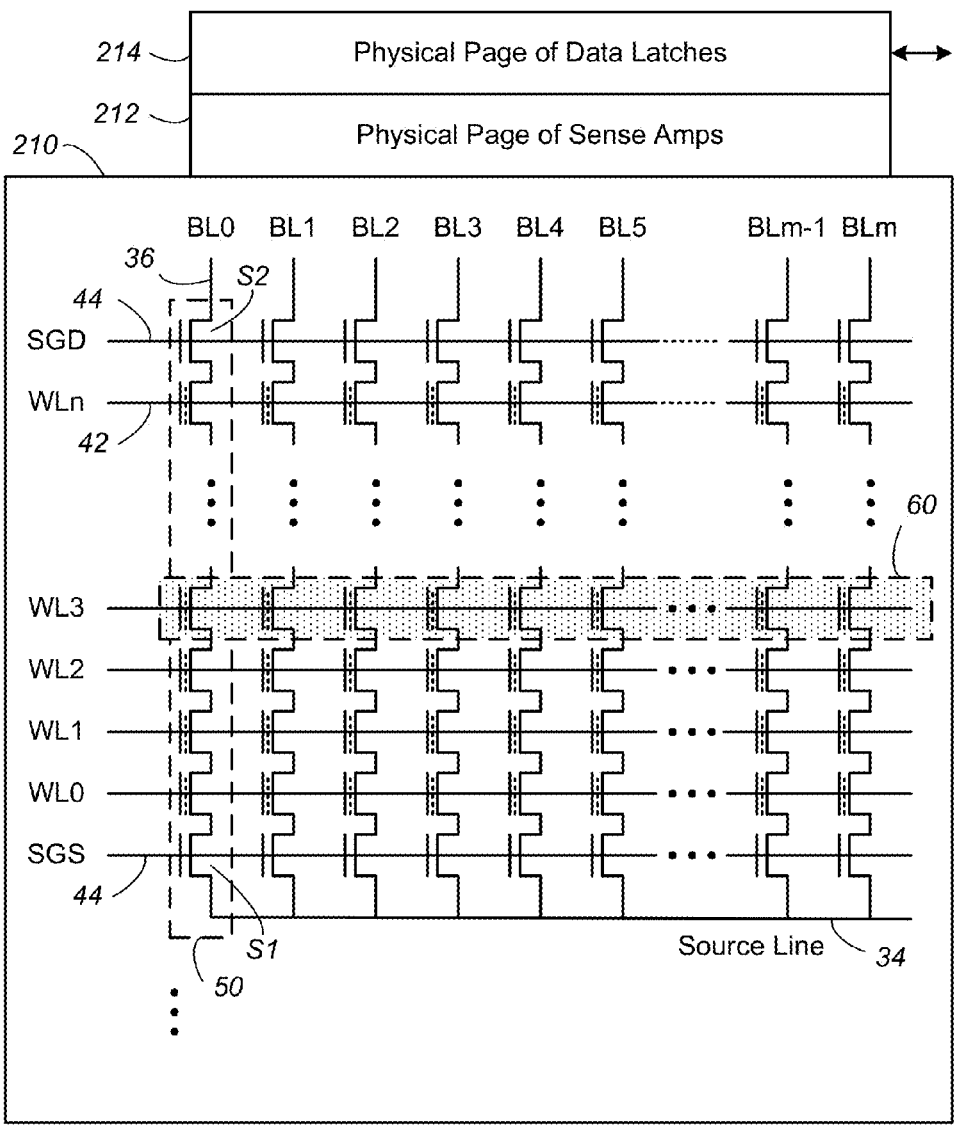
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "E" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 7:
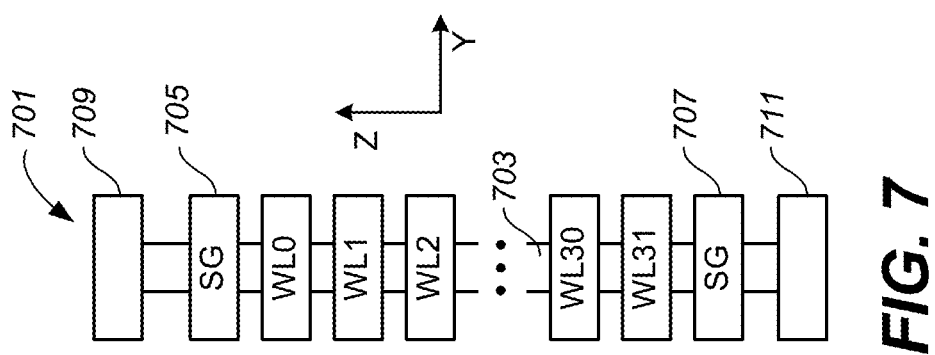
FIG. 7 shows an example of a physical structure of a 3-D NAND string.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
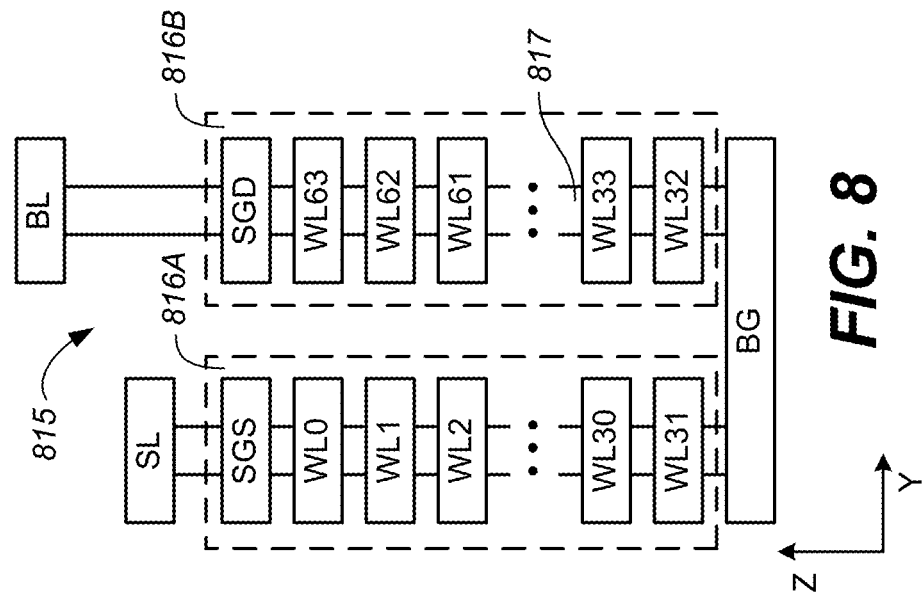
FIG. 8 shows an example of a physical structure of a U-shaped 3-D NAND string.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
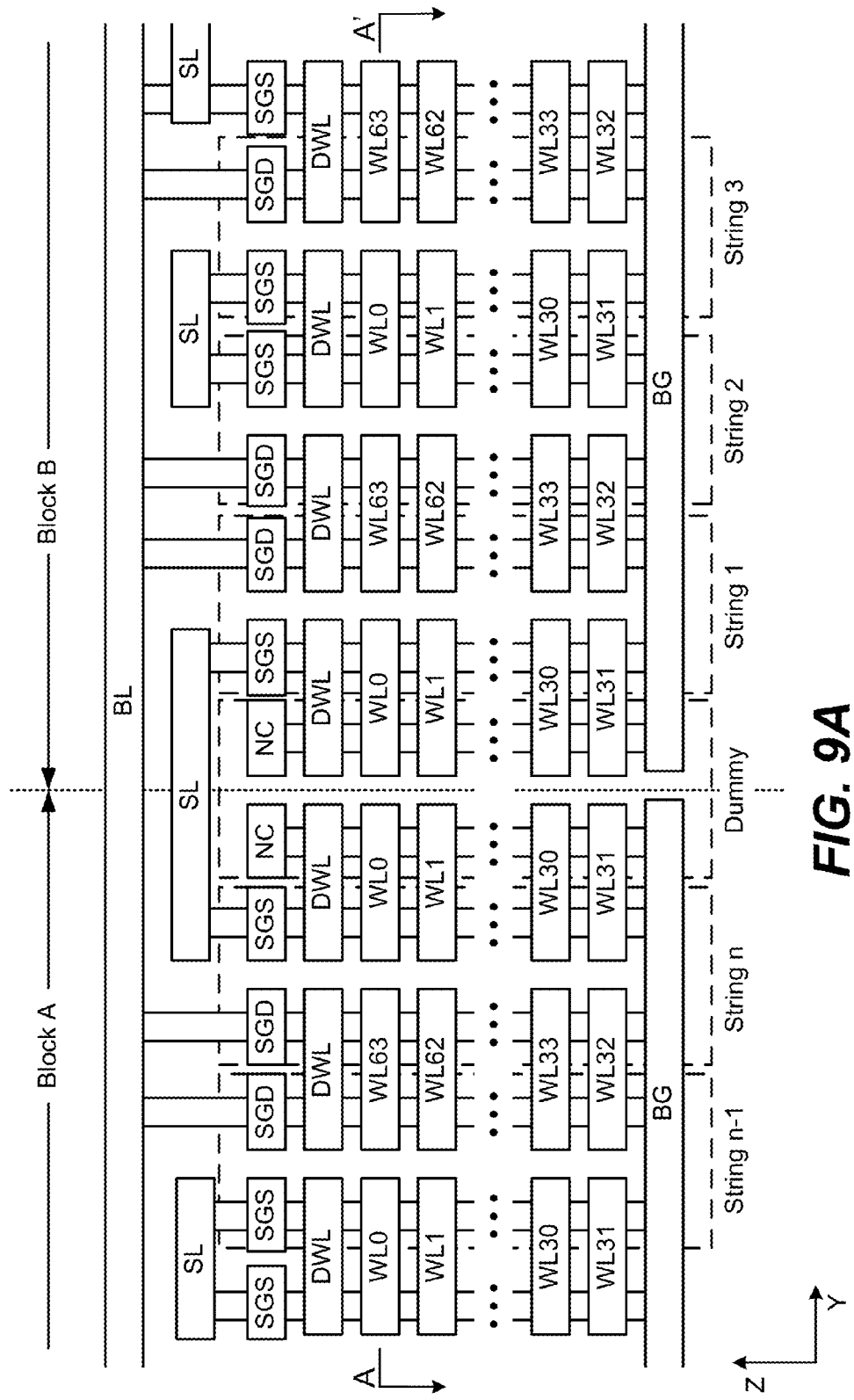
FIG. 9A shows a cross section of a 3-D charge trapping memory array in the y-z plane.

Vertical NAND strings may be arranged to form a 3-D NAND array in various ways. FIG. 9A shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

FIG. 9A shows where two blocks meet. Block A contains n strings connected to the bit line BL. While only strings n, and n-1 of Block A are shown, it will be understood that the repetitive structure continues to the left where strings 1 to n-2 are located. Block B contains n strings connected to bit line BL. While only strings 1-3 of Block B are shown, it will be understood that the repetitive structure continues to the right where strings 4 to n are located. It will also be understood that the cross section shown is along one of many bit lines that serve the block and that there are many similar bit lines extending along the y-direction, separated from each other in the x-direction (e.g. behind the plane of the cross section shown). Word lines extend in the x-direction, perpendicular to the plane of FIG. 9A, to connect sets of strings of different bit lines. Similarly, select lines extend in the x-direction so that a set of strings may be selectively connected, or isolated, as a unit. In the example shown, word lines are formed so that a single conductive strip forms a word line of two adjacent strings. Thus, for example, in Block B, string 1 and string 2 have word lines WL32-WL63 that are formed by common conductive strips. In contrast, select lines are not shared between neighboring strings. This allows separate selection of an individual set of strings within a block, even though the selected set of strings may include word lines that are not separately controllable from word lines of unselected strings.

FIG. 9A shows dummy word lines "DWL" separating select lines SGD, SGS, from host data word lines WL0-WL63. While host data word lines are used to store host data (i.e. data that may be sent to the memory from an external source with the expectation that the data will be returned in response to a read command), dummy word lines do not store host data. They may store nothing, or may store some dummy data that puts the dummy cells in a desirable condition (e.g. puts their threshold voltages at levels that make accessing other cells easier, or reduces risk of disturbance). The dummy word lines shown provide some protection for stored data.

Each block has a separate back gate, BG, so that back gate transistors of different blocks may be separately controlled. Back gates extend in the x-direction, perpendicular to the cross section of FIG. 9A, so that all back gate transistors of a block are controlled by a common back gate in this example. Control circuits are connected to the back gates of each block so that appropriate bias may be applied to back gates. The structure of back gates is further explained below.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 9B:
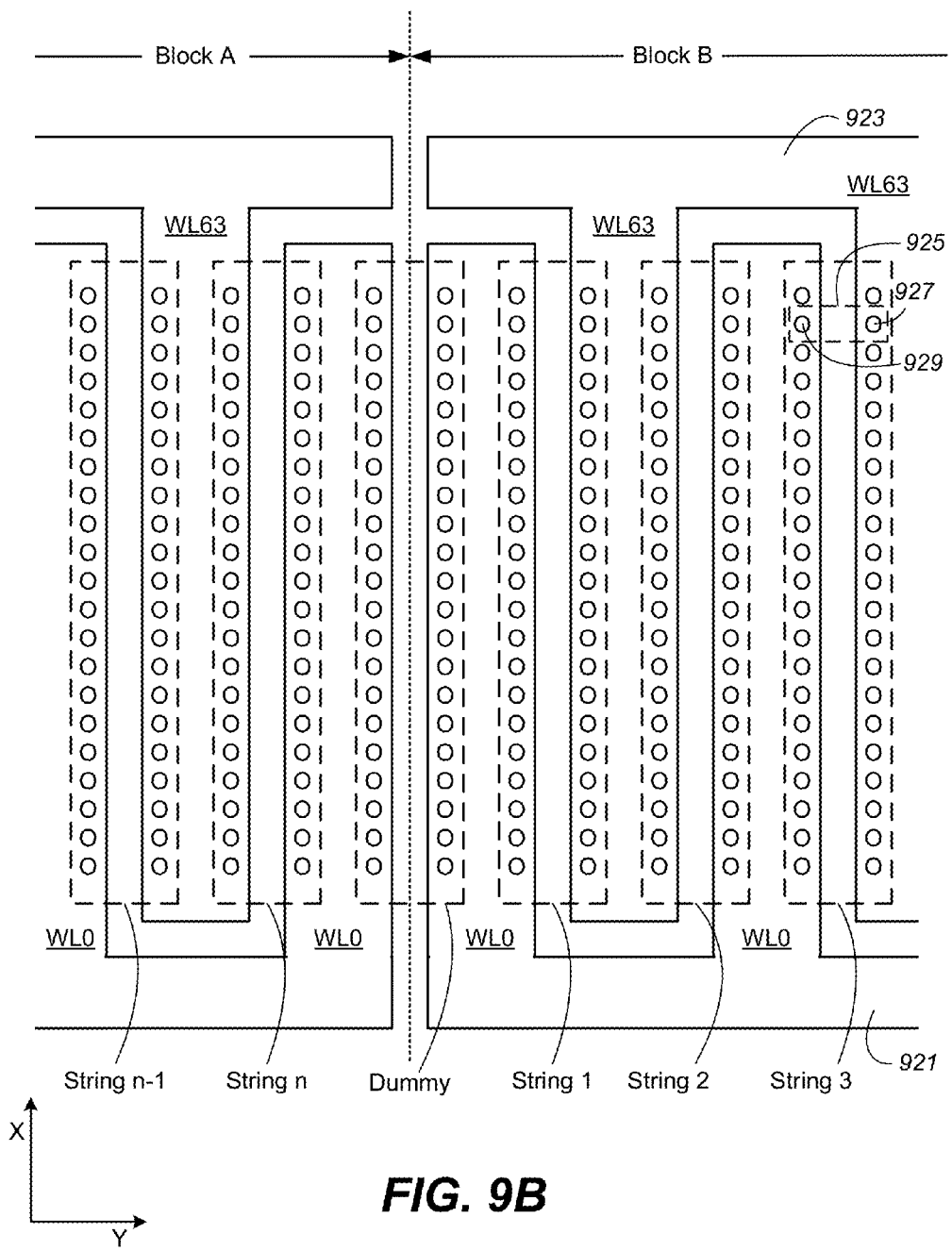
FIG. 9B shows a cross section of the 3-D charge trapping memory array of FIG. 9A along the x-y plane.

The 3-D NAND memory array of FIG. 9A is further illustrated in FIG. 9B, which shows a cross section along A-A' of FIG. 9A (i.e. along the x-y plane that intersects WL0 and WL63). It can be seen that word lines of a block are formed of strips of conductive material that are connected together. Thus, all word lines marked WL0 in different strings of a block are electrically connected together and are formed from a single electrically conductive body 921. Similarly, all word lines marked WL63 in different strings of a block are electrically connected together and are formed from a single electrically conductive body 923. The two bodies that form word lines of a block on a given level appear as interdigitated fingers extending from opposite sides of the block. These two bodies may be separated by Shallow Trench Isolation (STI) dielectric, or by any suitable insulator. A similar pattern may be found at each level of word lines (e.g. WL1 and WL62 are similarly interdigitated, as are WL2 and WL61, and so on). Word lines of different blocks are isolated from each other. Thus, WL0 of Block A is separate, and electrically isolated from WL0 of Block B. Similarly, WL63 of Block A is separate, and electrically isolated from WL0 of Block B.

Memory holes are shown as circles (memory holes are cylindrical in shape and extend in the z-direction, perpendicular to the cross section shown). A U-shaped NAND string 925 extends along two memory holes 927, 929, with one memory hole 927 passing through body 923 and the other memory hole 929 passing through body 921. A set of strings consists of all such strings that are aligned along the x-direction and that share select lines (which also extend along the y-direction). For example, one such set is made up of all strings indicated by "String 3" in Block B, including string 925. When a given set of strings within a block is selected, a selected word line (or portion of a word line, i.e. a subset of the bit lines that intersect the word line) may be read by applying appropriate word line voltages to the selected word line and to unselected word lines. A Back Gate (not shown in FIG. 9B) extends under the word lines of Block B to control all BG transistors of all strings in the block. When an appropriate bias is applied to the BG of Block B, the back gate transistor of string 925 and back gate transistors of all other similar strings indicated by "String 3" turn on to enable accessing of memory cells of String 3

Figures 10A, 10B:
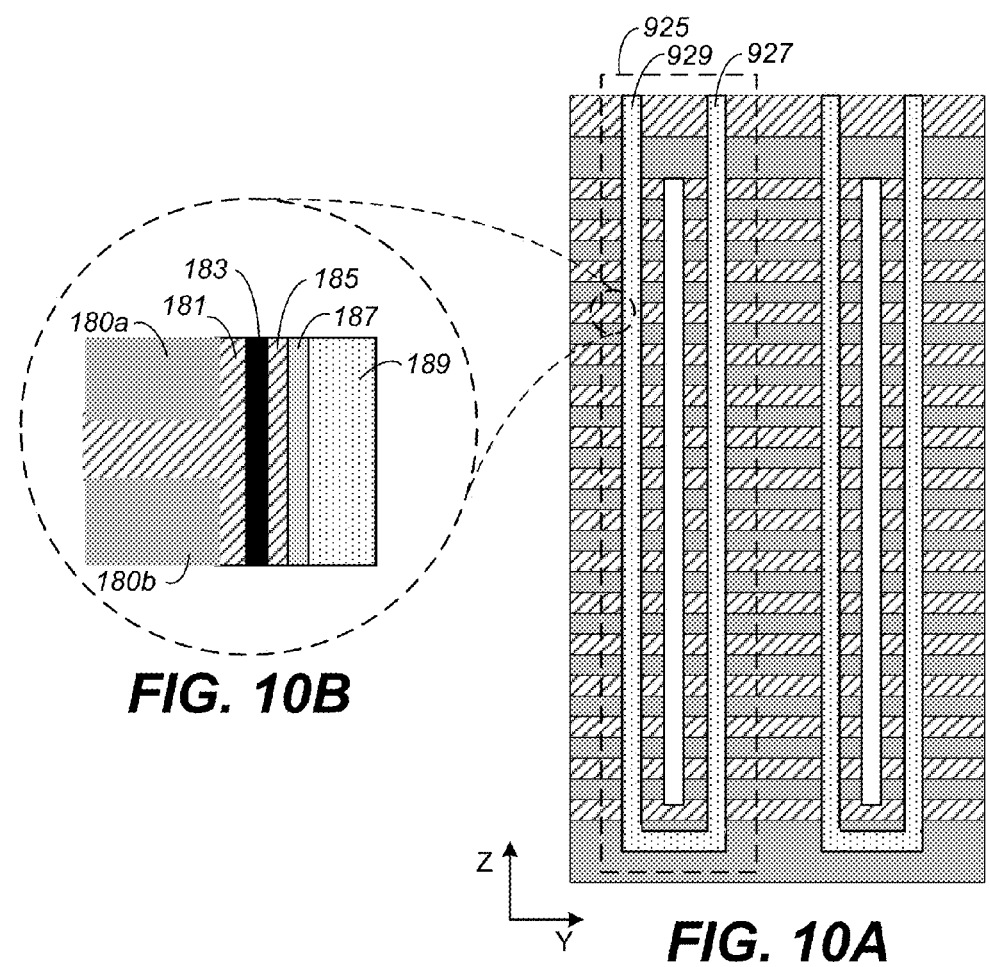
FIGS. 10A-10B show an example of a charge trapping memory.

FIG. 10A shows a cross section along a y-z plane that intersects memory holes 927, and 929 of NAND string 925 so that the structures formed within memory holes (memory hole structures) may be clearly seen. FIG. 10A shows that memory holes 927 and 929 are connected together at the bottom so that the two wings may be electrically connected in series.

FIG. 10B shows the structure of a stack of layers in the memory hole 929 where memory cells are formed. It can be seen that a blocking dielectric "Block" 181 is deposited on the walls of the memory hole to provide electrical isolation from word lines 180a, 180b. A Charge Trapping Layer (CTL) 183 is deposited on the blocking dielectric 181. The CTL layer 183 forms charge storage elements where the CTL is in close proximity to polysilicon word lines 180a, 180b. A tunnel dielectric 185 is deposited to provide electrical isolation and to allow charge to tunnel into the CTL layer 183 under certain conditions. A channel layer 187 is deposited to form the channel of the memory cells along the string. A core material 189 is deposited that forms the core of the column that is located in the memory hole.

When a NAND string is made using a memory hole, layers are deposited within the cylindrical memory hole so that the memory hole is filled in a substantially uniform manner with all deposited layers being present in at all levels (though some variation in memory hole diameter and other dimensions may occur). Thus, for example, a charge trapping layer in 3-D NAND memory is generally formed as a continuous tube that extends along a NAND string. The charge trapping layer forms charge trapping elements where it passes through a memory cell (i.e. where a memory hole passes through a word line).

3-D Block programming

In some three dimensional memory systems, a block includes multiple separately selectable sets of strings (as shown in FIGS. 9A-B). In some cases, programming of data proceeds from a word line in one string to a corresponding word line in the next string. For example, FIG. 11 shows how programming proceeds from WL0 of string 0, to WL0 of string 1, to WL0 of string 3, and so on until programming WL0 of all strings is complete. Then, programming may proceed to WL1. One result of such a programming sequence is that there are multiple word lines that are adjacent to unwritten word lines (i.e. adjacent to the boundary between written word lines and unwritten word lines). While in planar NAND, generally only one word line (the last written word line) is adjacent to unprogrammed word lines, in a three dimensional memory such as shown in FIG. 11, there may be one word line in each set of strings that is adjacent to unprogrammed word lines. Programming in this example may be SLC or MLC. MLC programming may program all memory states together in one pass (Full Sequence Programming) or may perform a subsequent pass to perform upper page programming. In either case, some data remains adjacent to unprogrammed word lines. Leaving data along a word line that is adjacent to unprogrammed word lines may have undesirable consequences, particularly in blocks in which this condition is likely to persist for an extended period.

In many blocks data is written somewhat frequently until a block is full. For example, a block may be maintained as an open block, ready to receive updated data, until the block is full or until the block is consolidated with another block (which generally results in a full block). In such blocks, data does not generally remain adjacent to unwritten word lines for an extended period of time. Additional data is written in the previously unwritten space, or the data is consolidated by being copied to another block and erased from the present block. However, this may not be true of all blocks or all types of data.

In one example, data may remain adjacent to unwritten word lines for an extended period of time because the data is system control data that is seldom updated and that is stored in dedicated blocks. For example a boot block or file system block may contain such infrequently written data. When such blocks are present in planar NAND memories, a programmed word line may remain adjacent to unprogrammed word lines for an extended period of time because the data is not updated, and no further data is written in the adjacent word lines. In three dimensional memory systems where there are multiple sets of strings in a block, there may be multiple such word lines in a given block. A written word line may remain with an unwritten neighbor for longer in such memories because the order of writing proceeds from string to string before returning to the neighbor (i.e. next n−1 writes to the block are to other strings, where n is the number of separately selectable sets of strings in the block). This can cause problems in certain memory systems, particularly charge trapping memories in which charge migration may occur.

Charge Migration

Memory cells in many planar NAND arrays are formed using floating gates as charge storage elements. Because floating gates are formed of conductive material, in which charge is free to flow, each memory cell generally has a separate floating gate that is electrically isolated from floating gates of neighboring cells. In contrast, charge trapping memory arrays are formed using charge trapping material to form charge storage elements. Because charge is trapped in such material, and is not free to flow, it is possible to form charge storage elements of multiple cells from a single continuous portion of such material. This obviates the need to provide electrical isolation between such elements. This is particularly useful in three dimensional memory systems where vertically stacked memory cells would make such isolation difficult to achieve. Therefore, many three dimensional memory arrays use continuous portions of charge trapping material that extend vertically through multiple memory cells. For example the charge trapping layer 183 in FIGS. 10A-B extends as a vertical tube of charge trapping material. A planar NAND memory may use strips of charge trapping material that form charge storage elements of multiple memory cells.

While a suitable material for a charge trapping layer is generally chosen so that charge remains trapped after programming, such materials may allow some movement of charge over an extended period of time. For example, after programming, the charge stored the charge storage element of a memory cell may tend to migrate from the location where it was programmed. Where such a charge storage element is connected by a portion of charge storage material to charge storage elements of unwritten cells, charge may tend to migrate to the unwritten portion (i.e. tend to migrate from area with charge to area without charge) where electrons may combine with holes.

FIG. 12 shows a cross section along a portion of a memory hole that is similar to the view shown in FIG. 10B. In this example, programming has occurred along WL0, while subsequent word lines (WL1, WL2, etc.) remain unprogrammed. Programming places negative charge (shown by electrons "e⁻") in CTL 183 where CTL 183 passes through WL0. However, this charge may tend to migrate towards portions of CTL 183 that do not contain charge or contain positive charge, or "holes" (shown by positive charge "+"). Erasing may result in hole generation so that unwritten (erased) cells have some positive charge. In this case such charge migrates downwards towards unwritten word lines (as shown by arrow). While such charge migration may be a relatively small effect, and may be ignored in many cases, it may become significant over an extended period of time. In particular, if left in the condition shown (WL1 and WL2 unwritten) for an extended period of time, data along WL0 may be affected by such charge migration. Ultimately, data along WL0 will develop errors (bad bits) because loss of charge will affect threshold voltages of memory cells causing the memory cells to be misread. Ultimately, the number of bad bits in such data may exceed the capacity of the Error Correction Code (ECC) so that the data becomes uncorrectable by ECC (UECC) and is lost. Losing any data in this manner is undesirable, and losing system control data is particularly undesirable.

According to an aspect of the present invention, data that is likely to be affected by charge migration is identified and stored in a way that protects from loss. In one example, such protection is provided by writing three copies of the data, along three neighboring word lines, with the data aligned so that identical bits are placed along the same portion of charge trapping material. Generally, charge migration tends to mainly affect the programmed word line nearest to the unprogrammed word lines (any charge migration in upper word lines should be much less) so that the copy along the lowest written word line may be considered a sacrificial copy. A copy of the data in the middle word line of three such word lines may be considered a safe copy because it has identical data on either side and therefore has a low risk for charge migration. The top copy may be at intermediate risk depending on the data (if any) stored above it.

FIG. 13 shows an example where three copies of data are written along three adjacent word lines (WL0, WL1, and WL2) so that neighboring bits along different word lines are identical. The three programmed memory cells shown (along WL0, WL1, and WL2) are programmed with the same data and therefore have the same amount of charge in their respective charge storage elements. While there may be some electron migration from memory cells of WL2 towards unprogrammed memory cells along WL3, there is no significant electron migration from memory cells along WL1 (e.g. electron migration is not sufficient to cause bad bits, or to cause UECC data along WL1 in a given time period).

Figures 14A, 14B, 15:
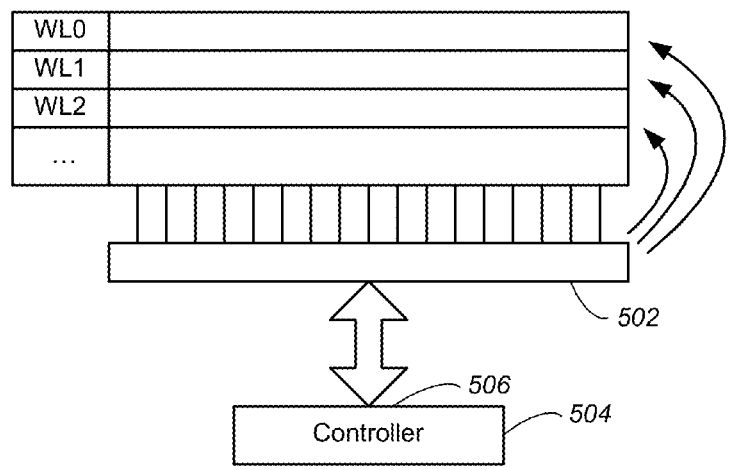
FIGS. 14A-B illustrate a scheme for programming system control blocks in 3-D memory.
FIG. 15 illustrates an example of programming along three word lines of a system control block.

FIG. 14A further illustrates writing three copies along three neighboring word lines. Data 0 is written to WL0, WL1, and WL2 of string 0. Subsequently, data 1 is written to WL0, WL1, and WL2 of string 1, and so on. Portions of data may be stored in SLC or MLC format (i.e. memory cells may store just one bit, or more than one bit). Portions of data along immediately adjacent word lines are aligned so that neighboring cells along the same NAND string, that share a CTL portion, have the same states (same amount of charge). Thus, three identical copies are stored (no different scrambling, or different alignment). Subsequently, when it is time to read the data, the middle copy (copy along WL1 in FIG. 14A) may be read because this is considered a safe copy.

While charge migration may affect memory cells of other word lines along the same string, charge generally does not migrate between charge trapping layers of different strings. Therefore, while string 5 remains unwritten, there is generally no need to protect data along string 4 from charge migration to string 5. Similarly, there is generally no need to protect data from charge migration between blocks.

While FIG. 14A shows the writing of the first three word lines of a block, later writes may be handled somewhat differently. In particular, where some word lines are already written there will be data along word lines on one side of any new write (physically above new word line, along lower numbered word lines, in FIG. 14A). It may not be necessary to write three word lines in this situation (though in some cases it may be desirable). Instead, the previously written word line may provide sufficient protection against charge migration to protect new data on one side so that protection is only needed on the other side and just two copies are written.

FIG. 14B illustrates a write that occurs to the same block as FIG. 14A at some later time. Here, WL0 of all N strings of the block have been written and the writing returns to string 0. Two copies of data N+1 are written along WL3 and WL4 of string 0. Similarly, two copies of data N+2 are written along WL3 and WL4 of string 1 and two copies of data N+3 are written along WL3 and WL4 of string 2. Copies are aligned as before to ensure that cells along the same vertical NAND string, on word lines WL3 and WL4, receive the same data and are programmed to the same levels of charge. In this case, a copy of data along WL3 may be considered a safe copy with a copy along WL4 being considered a sacrificial copy. No additional copy of new data (data N+1, N+2, N+3) is written above the safe copies along WL3 because the previously written data along WL0, WL1, and WL2 of these strings reduces the risk of charge migration in this direction. While data above the safe copy on WL3 is not identical to the safe copy, it may still provide sufficient protection in some cases.

It will be understood that the programming scheme required to protect a safe copy of data depends on the risk of charge migration which in turn may depend on the geometry of the memory array, materials used, charge levels used for memory states, environmental factors (temperature etc.) and other parameters. Furthermore, the degree of protection required may depend on a number of factors including: the capacity of the ECC scheme to correct bad bits, and the time period over which protection is required. In the example of FIGS. 14A-B, one copy on either side of a safe copy provides sufficient protection in an unwritten string, while subsequent writes only require one copy on the unwritten side of the safe copy (physically below the safe copy in FIG. 14B). In other examples, three copies may continue to be written for subsequent writes in the same set of strings (e.g. write WL3, WL4, and WL5 together, with the same data, to provide a safe copy along WL4). In other cases, more than three copies may be written to ensure that a safe copy remains safe. For example, two sacrificial copies may be written between the safe copy and any unwritten word lines.

Clearly writing additional data takes additional time, and writing the same data three times generally takes more time than writing it once. However, extra time required to implement aspects of the present invention may be reduced by programming the multiple copies in an efficient manner. In many memory systems, data to be programmed is held in a set of latches that hold a page of data. When a write command is sent by a memory controller, the data to be written is generally transferred to the data latches, and the data is then written from the data latches to memory cells of a word line. Subsequently, another write command may be received with more data which is similarly latched and written to memory cells along another word line. While this same scheme may be used multiple times to program the same data along multiple word lines, it is possible to eliminate some steps.

FIG. 15 illustrates an example where the same data is written from data latches 502 three times to three different word lines (WL0, WL1, and WL2). In this example, instead of transferring the same data from the memory controller 504 three times over a memory bus 506, the data is maintained in the data latches throughout the programming along the three word lines. Thus, the data only needs to be transferred from the controller 504 over the memory bus 506 one time and subsequent programming occurs on-chip. Thus, the operation is faster because the transfer from the controller occurs only once and the memory bus 506 may be used for other purposes while programming occurs (i.e. controller may use the bus for communication with other memory dies while data is programmed from the on-chip latches to the word lines). In some cases, a controller may send three write commands, the first accompanied with a transfer of data and the second and third commands sent without additional data. Alternatively, a controller may use a command that indicates data is to be programmed three times along three immediately adjacent word lines. In this case, the data is transferred once with a single write command and the controller and memory bus do not have to do anything further. The memory die receives the data into data latches and programs it along three word lines without any further input.

Dummy Data

In some nonvolatile memory systems, data retention is worse in blocks that store little data than in more full blocks. Thus, a block that stores little data may have poor data retention over time compared with a block that stores a lot of data. For example, the block of FIG. 11 shows a block at a stage where only one word line per string is written. All other word lines are unwritten. This scenario may result in poor data retention. FIG. 14A shows a scenario in which three word lines are written in strings 0-4 and all other word lines remain unwritten. While this arrangement provides protection to safe copies of data on WL1, the small amount of written data in the block may not be optimal for data retention.

In many cases, blocks that have large areas of unwritten space do not remain in that condition for long. However, as discussed above, certain blocks may remain largely unwritten for long periods. For example, blocks that are dedicated to certain system control data, such as firmware, mapping data, or error log data that is not frequently updated may remain largely unwritten for extended periods between updates.

According to an aspect of the present invention, blocks that are used for storage of system control data (or are otherwise likely to remain substantially empty for an extended period of time) may be formatted by programming dummy data along a number of word lines prior to storage of any system control data. Thus, when system control data is written in such a block, unwritten space in the block has already been decreased, and written space increased, to a level that provides acceptable data retention.

FIG. 16 shows an example of a block that was formatted for storage of system control data or for another use that is likely to leave long periods between writes. Formatting included programming dummy data along multiple word lines prior to storage of any system control data. In this example, dummy data was programmed along WL0-WLX of all strings. The value of X chosen in any particular case depends on data retention requirements and the expected benefit from programming a given number of word lines.

Because dummy data is not host data, or otherwise useful data, dummy data generally does not have to be available for later recovery. This allows some techniques to be used to make programming of such dummy data faster than normal programming. For example, verification may be limited, or skipped because it may not be important whether particular memory cells reach particular states as long as cells in aggregate reach some level of charge. Large voltage pulses may be used to rapidly program cells because overprogramming is not generally a concern and there is no previously written data to disturb. Dummy data may be programmed without separately transferring the data from a host for each word line. Thus, dummy data may be maintained in data latches continuously while it is programmed to successive word lines. Dummy data may be written in a random pattern in some cases. In some cases dummy data is written in a predetermined pattern that is identified as providing protection from charge migration. Such a pattern may be specific to a particular memory design and may be adaptive over time.

FIG. 16 shows system control data stored along word lines WLX+1-WLX+3. In this example, three copies of each portion are stored along three immediately adjacent word lines as before so that a safe copy is stored along WLX+2. In other examples, just two copies may be written along two word lines in this manner because dummy data may be considered to give sufficient protection on one side. While dummy data may not result in identical charge levels in neighboring cells along a NAND string, dummy data may provide some charge in most cells which may be sufficient to significantly reduce charge migration towards an area programmed with dummy data.

Figure 17:
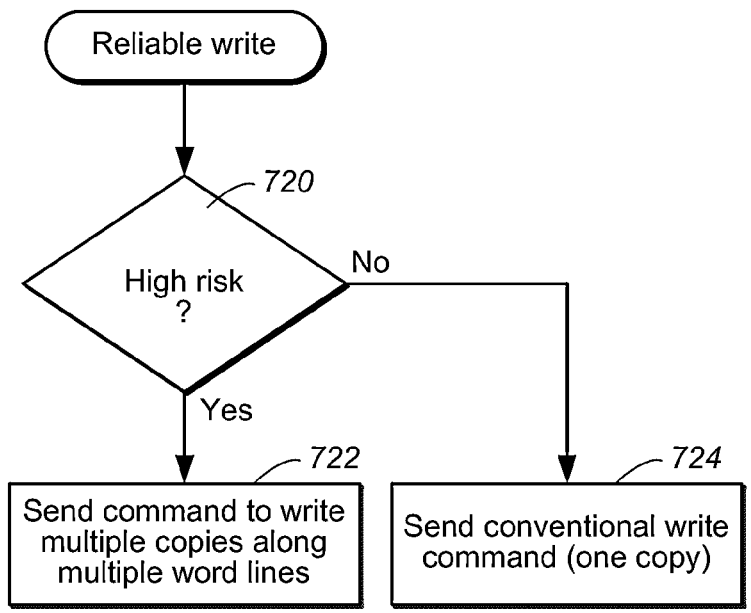
FIG. 17 shows an example of a reliable write scheme for charge trapping memory.

FIG. 17 illustrates a scheme for reliable writing of important data. A determination is made 720 as to whether data is high risk or not. High risk data may be any data that is likely to remain adjacent to unwritten space in a block for an extended period of time. This may include system control data such as firmware, mapping data, error log data, or other data that is stored in dedicated blocks and is infrequently updated. However, high risk data is not limited to system control data and may include any data, including host data, which is likely to remain adjacent to unwritten space for long. If data is identified as high risk then the data is sent with a command to write multiple (e.g. two or three) copies of the data along multiple immediately adjacent word lines 722. The data is transferred to data latches once and written in memory multiple times. In other examples, multiple write commands may be used while the data is transferred only once. If data is not high risk, then a conventional write command may be sent 724 (i.e. a command that causes a single copy to be written from data latches to the memory array.

Figure 18:
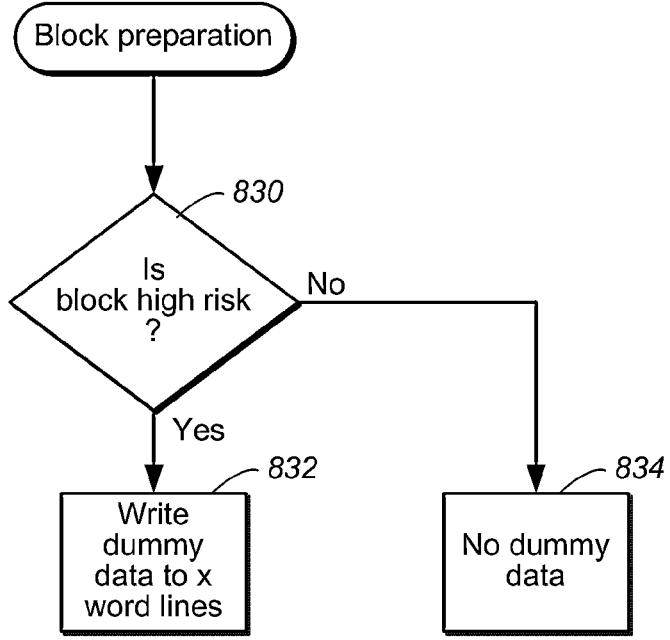
FIG. 18 shows a block preparation scheme for charge trapping memory.

FIG. 18 shows an example of block preparation, or formatting that may improve data retention for some data stored in some blocks. A determination is made 830 as to whether a block has a high risk for data retention errors. For example, a block that is to be a dedicated block for storage of system control data may be considered a high risk block. When such a block is identified, a pattern of dummy data is written in the block prior to storage of any other data 832. For example, the first X word lines may be written with dummy data. If the block is not high risk then no dummy data may be required and none is written 834.

Figure 19:
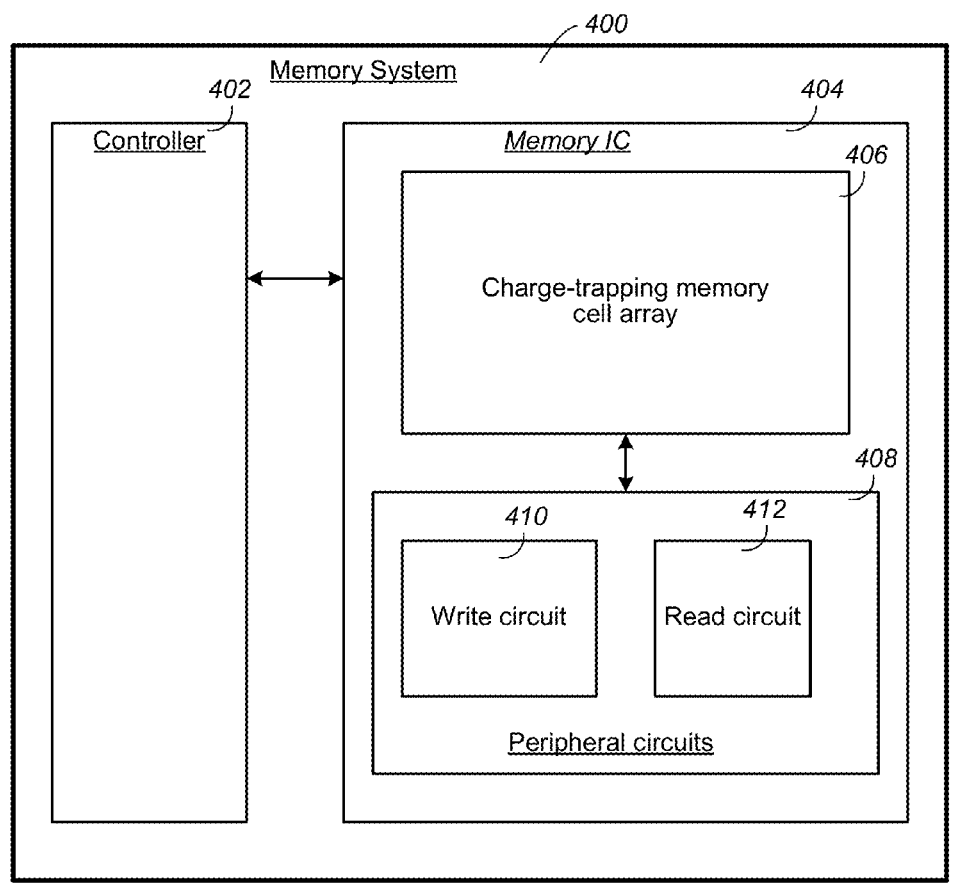
FIG. 19 shows hardware that may be used to implement aspects of the present invention.

FIG. 19 shows an example of hardware that may be used to implement aspects of the present invention. In particular, FIG. 19 shows a memory system 400 that includes a memory controller 402 and a memory integrated circuit (IC) 404. Memory IC 404 includes a charge-trapping memory cell array 406 and peripheral circuits 408. Memory cell array 406 contains some blocks that are dedicated to store system control data and some blocks that store host data. Peripheral circuits 408 include write circuit 410 and read circuit 412. Write circuit 410 is configured to write dummy data to some blocks in order to format the blocks for better data retention. Write circuit 410 is further configured to write multiple copies of system control data aligned along multiple word lines so that a safe copy is provided and one or more sacrificial copies are provided. Write circuit 410 may contain one or more rows of data latches to hold data throughout such multiple writes.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a three-dimensional nonvolatile memory formed in a plurality of physical levels of charge-trapping memory cells disposed above a substrate comprising:
   receiving a portion of data to be stored in the three-dimensional nonvolatile memory;
   determining whether the portion of data is likely to be affected by charge migration between charge-trapping memory cells; and if the portion of data is determined likely to be affected by charge migration between charge-trapping memory cells then storing a first copy of the portion of data along a first word line, storing a second copy of the portion of data along a second word line, and storing a third copy of the portion of data along a third word line, the first word line lying immediately above the second word line and the third word line lying immediately below the second word line, the first, second, and third copies of the portion of data aligned so that each memory cell along the second word line stores the same charge as a neighboring memory cell of the first word line above and the same charge as a neighboring memory cell of the third word line below.

2. The method of claim 1 wherein, if the portion of data is determined not likely to be affected by charge migration between charge-trapping memory cells then storing a single copy of the portion of data along a word line with other data along neighboring word lines above and below.

3. The method of claim 1 wherein the determining that the portion of data is likely to be affected by charge migration includes determining that the portion of data is a portion of system control data to be stored in a dedicated block that is dedicated to storage of system control data.

4. The method of claim 3 wherein the portion of system control data is one of:
firmware for memory system operation, mapping table data, or error log data.

5. The method of claim 3 further comprising:
prior to storing the first, second, and third copies of the portion of system control data in the dedicated block, programming dummy data to a plurality of word lines of the dedicated block.

6. The method of claim 1 further comprising:
subsequently reading the portion of data from the array by reading only the second copy of the data.

7. The method of claim 1 wherein the portion of data is written to the first, second, and third word lines from a set of on-chip data latches that maintains a copy of the portion of data throughout the writing to the first, second, and third word lines.

8. The method of claim 7 wherein the data is written to the first, second, and third word lines in response to a single write command that indicates three copies of the data are to be written.

9. The method of claim 1 wherein memory cells along the first, second, and third word lines include charge trapping elements that are formed in portions of charge trapping material that extend in a direction that is perpendicular to a plane of the substrate and perpendicular to the first, second, and third word lines.

10. The method of claim 9 wherein the portions of charge trapping material are tubular portions that extend through vertical memory holes in the first, second, and third word lines.

11. A three-dimensional nonvolatile memory system comprising:
a three-dimensional nonvolatile memory formed in a plurality of physical levels of charge-trapping memory cells disposed above a substrate with portions of charge-trapping material extending in a direction perpendicular to a plane of the substrate so that an individual charge-trapping portion forms charge-trapping elements of memory cells in the plurality of physical levels; and
a write circuit that is configured to use a plurality of write schemes including a conventional write scheme in which a single copy of a received portion of data is written along a word line, and a reliable write scheme in which three identical copies of a portion of data that is likely to be affected by charge migration are written along three vertically adjacent word lines, the three identical copies written so that a stack of three memory cells along the three vertically adjacent word lines that are connected by a portion of charge trapping material are identically written.

12. The three-dimensional nonvolatile memory system of claim 11 wherein the write circuit is configured to use the reliable write scheme for system control data, the system control data including at least one of: firmware for memory system operation, mapping table data, and error log data.

13. The three-dimensional nonvolatile memory system of claim 12 wherein the three-dimensional memory is formed as a plurality of individually erasable blocks, the plurality of individually erasable blocks including at least one dedicated block that is dedicated to storage of system control data.

14. The three-dimensional nonvolatile memory system of claim 13 wherein the plurality of individually erasable blocks further includes host data blocks that are written using the conventional write scheme and that store data received from a host.

15. The three-dimensional nonvolatile memory system of claim 13 wherein the write circuit is configured to write dummy data to a plurality of word lines of the dedicated block prior to writing system control data to the dedicated block and the write circuit is not configured to write dummy data to word lines of the host data blocks prior to storage of the data received from the host in the host blocks.

16. The three-dimensional nonvolatile memory system of claim 13 wherein the charge-trapping memory cells form series-connected NAND strings that extend vertically from the substrate along the portions of charge trapping material, each of the plurality of individually erasable blocks containing a plurality of separately selectable sets of NAND strings.

17. The three-dimensional nonvolatile memory system of claim 11 further comprising:
a row of data latches in the write circuit, the row of data latches configured to maintain the portion of data that is likely to be affected by charge migration throughout the writing of the three identical copies to the three vertically adjacent word lines.

18. The three-dimensional nonvolatile memory system of claim 11 wherein an individual portion of charge-trapping material is a tubular portion located within a memory hole that extends vertically through word lines of the plurality of physical levels.

19. A method of operating a three-dimensional nonvolatile memory formed in a plurality of physical levels of charge-trapping memory cells disposed above a substrate comprising:
receiving a portion of data to be stored in the three-dimensional nonvolatile memory;
determining whether the portion of data is system control data that is likely to be affected by charge migration between charge-trapping memory cells;
if the portion of data is determined not to be system control data that is likely to be affected by charge migration between charge-trapping memory cells then storing a single copy of the portion of data along a word line with other data along neighboring word lines above and below; and
if the portion of data is determined to be system control data that is likely to be affected by charge migration between charge-trapping memory cells then storing a first copy of the portion of system control data along a first word line, storing a second copy of the portion of system control data along a second word line, and storing a third copy of the portion of system control data along a third word line, the first word line lying immediately above the second word line and the third word line lying immediately below the second word line in a dedicated block that is dedicated to storage of system control data, the first, second, and third copies of the portion of system control data aligned so that each memory cell along the second word line stores the same charge as a neighboring memory cell of the first word line above and the same charge as a neighboring memory cell of the third word line below.

20. The method of claim 19 further comprising:
prior to storing the first, second, and third copies of the portion of system control data in the dedicated block, programming dummy data to a plurality of word lines of the dedicated block.

21. A three-dimensional nonvolatile memory system comprising:
a three-dimensional nonvolatile memory formed in a plurality of physical levels of charge-trapping memory cells disposed above a substrate with portions of charge-trapping material extending in a direction perpendicular to a plane of the substrate so that an individual charge-trapping portion forms charge-trapping elements of memory cells in the plurality of physical levels;
host data blocks in the three-dimensional nonvolatile memory;
dedicated blocks in the three-dimensional nonvolatile memory, the dedicated blocks being dedicated to storage of system control data; and
a write circuit that is configured to use a plurality of write schemes including a conventional write scheme in which a single copy of a received portion of data is written along a word line of a host data block, and a reliable write scheme for system control data in which three identical copies of a portion of system control data are written along three vertically adjacent word lines of a dedicated block, the three identical copies written so that a stack of three memory cells along the three vertically adjacent word lines that are connected by a portion of charge trapping material are identically written.

* * * * *